(12) United States Patent
Fang et al.

(10) Patent No.: US 11,887,918 B2
(45) Date of Patent: Jan. 30, 2024

(54) LEAD FRAME, PACKAGED INTEGRATED CIRCUIT BOARD, POWER CHIP, AND CIRCUIT BOARD PACKAGING METHOD

(71) Applicant: Huawei Technologies Co., Ltd., Shenzhen (CN)

(72) Inventors: Xuanwei Fang, Dongguan (CN); Zhiqiang Xiang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 51 days.

(21) Appl. No.: 17/709,100

(22) Filed: Mar. 30, 2022

(65) Prior Publication Data

US 2022/0223506 A1 Jul. 14, 2022

Related U.S. Application Data

(63) Continuation of application No. PCT/CN2020/117850, filed on Sep. 25, 2020.

(30) Foreign Application Priority Data

Sep. 30, 2019 (CN) .......................... 201910944602.5

(51) Int. Cl.
*H01L 23/498* (2006.01)
*H01L 25/16* (2023.01)
(Continued)

(52) U.S. Cl.
CPC ........ *H01L 23/49811* (2013.01); *H01L 25/16* (2013.01); *H05K 1/18* (2013.01);
(Continued)

(58) Field of Classification Search
CPC ........ H05K 1/18; H05K 1/1281; H05K 3/284; H05K 3/3421; H01L 23/495;
(Continued)

(56) References Cited

U.S. PATENT DOCUMENTS 7,183,485 B2 * 2/2007 Groothuis ........... H01L 23/4951
257/676
7,687,892 B2 * 3/2010 Espiritu ........... H01L 23/49551
361/813
(Continued)

FOREIGN PATENT DOCUMENTS

CN 101026110 A 8/2007
CN 101752341 A 6/2010
(Continued)

*Primary Examiner* — Tuan T Dinh
(74) *Attorney, Agent, or Firm* — Leydig, Voit & Mayer, Ltd.

(57) ABSTRACT

Disclosed is a packaging solution, such as a lead frame for circuit board packaging, a packaged integrated circuit board, a power chip, and a circuit board packaging method. The lead frame includes a plurality of frame units disposed in parallel in a first direction. The frame unit includes a hollow bezel, and a plurality of pins and connecting ribs that are disposed in the bezel. Each pin includes a first pin part and a second pin part that extend in a second direction and are integrally formed. The first pin part is disposed in the bezel, the first pin part is configured to electrically connect to a circuit board, and the second pin part is connected and fastened to the bezel. The second direction is perpendicular to the first direction. The connecting ribs are connected among the plurality of pins and the bezel.

15 Claims, 15 Drawing Sheets

(51) Int. Cl.
*H05K 1/18* (2006.01)
*H05K 3/00* (2006.01)
*H05K 3/28* (2006.01)
*H05K 3/34* (2006.01)

(52) U.S. Cl.
CPC ........... *H05K 3/0097* (2013.01); *H05K 3/284* (2013.01); *H05K 3/3405* (2013.01); *H05K 2201/1034* (2013.01); *H05K 2203/0228* (2013.01); *H05K 2203/1316* (2013.01)

(58) Field of Classification Search
CPC ......... H01L 23/4951; H01L 23/49531–49548; H01L 21/48–49
USPC ......... 361/760, 772–778, 813; 257/666–669, 257/674–676, 692–698, 730
See application file for complete search history.

(56) References Cited

U.S. PATENT DOCUMENTS

| | | | | |
|---|---|---|---|---|
| 7,939,933 | B2* | 5/2011 | Itou | H01L 21/561 |
| | | | | 257/676 |
| 8,432,023 | B1* | 4/2013 | Kim | H01L 23/49541 |
| | | | | 257/692 |
| 9,153,476 | B2* | 10/2015 | Chi | H01L 24/19 |
| 9,704,725 | B1* | 7/2017 | Kim | H01L 21/4842 |
| 2003/0127711 | A1* | 7/2003 | Kawai | H01L 23/49503 |
| | | | | 257/691 |
| 2005/0199987 | A1* | 9/2005 | Danno | H01L 21/561 |
| | | | | 257/784 |
| 2007/0193027 | A1 | 8/2007 | Takakusaki et al. | |
| 2008/0315381 | A1 | 12/2008 | Yoshida | |
| 2009/0014851 | A1* | 1/2009 | Choi | H01L 23/49541 |
| | | | | 257/676 |
| 2016/0284632 | A1* | 9/2016 | Shinohara | H01L 23/49555 |

FOREIGN PATENT DOCUMENTS

| | | |
|---|---|---|
| CN | 101937898 A | 1/2011 |
| CN | 103021992 A | 4/2013 |
| CN | 103117263 A | 5/2013 |
| CN | 103247580 A | 8/2013 |
| CN | 203760460 U | 8/2014 |
| CN | 104332419 A | 2/2015 |
| CN | 204706557 U | 10/2015 |
| CN | 105374789 A | 3/2016 |
| CN | 106298553 A | 1/2017 |
| CN | 105470234 B | 12/2017 |
| CN | 206877984 U | 1/2018 |
| CN | 207705186 U | 8/2018 |
| CN | 110752197 A | 2/2020 |
| JP | S6114731 A | 1/1986 |
| JP | H06310623 A | 11/1994 |
| JP | H08204119 A | 8/1996 |
| JP | 2001156215 A | 6/2001 |
| JP | 2005228898 A | 8/2005 |

* cited by examiner

LEAD FRAME, PACKAGED INTEGRATED CIRCUIT BOARD, POWER CHIP, AND CIRCUIT BOARD PACKAGING METHOD

CROSS-REFERENCE TO RELATED APPLICATIONS

This application is a continuation of International Application No. PCT/CN2020/117850, filed on Sep. 25, 2020, which claims priority to Chinese Patent Application No. 201910944602.5, filed on Sep. 30, 2019. The disclosures of the aforementioned applications are hereby incorporated by reference in their entireties.

TECHNICAL FIELD

This application relates to the field of integrated circuit packaging technologies, and in particular, to a lead frame for circuit board packaging, a packaged integrated circuit board, and a packaging method for packaging a circuit board by using the lead frame.

BACKGROUND

With development of communications technologies, a demand for a power circuit that supplies power to a communications apparatus is also increasing. To implement power conversion with relatively high efficiency, a printed circuit board (PCB) of the power circuit includes a relatively large quantity of electronic components, but a use environment of the power circuit is increasingly severe. For example, the power circuit is required to occupy a smaller area, and have stronger anti-corrosion and anti-radiation capabilities. Currently, the following solution is used: The printed circuit board of the power circuit is directly plastically packaged by being covered with a plastic packaging material, and then a pin for a conductive connection is connected to a conductive pad exposed by grinding a part of the plastic packaging material. However, in this manner of directly plastically packaging the printed circuit board and then connecting the pin, the plastic packaging material and the printed circuit board are prone to be cracked, causing a failure in the plastic packaging of the power circuit. Therefore, safety and reliability are relatively low.

SUMMARY

A technical problem to be resolved in embodiments of this application is to provide a circuit board packaging solution for improving safety and reliability. The packaging solution includes a lead frame for circuit board packaging, a packaged integrated circuit board, a power chip, and a circuit board packaging method.

The packaging method includes the following steps:
providing a circuit board, where the circuit board includes a first base board, the first base board includes a first base surface and a second base surface that are opposite, and a plurality of electronic components, a plurality of conductive lines, and a plurality of conductive connection pads are disposed on each of the first base surface and the second base surface;
providing a lead frame, where the lead frame includes a plurality of frame units disposed in parallel in a first direction, the frame unit includes a hollow bezel, a plurality of pins, and connecting ribs, each pin includes a first pin part and a second pin part that extend in a same direction and that are integrally formed, the first pin part is disposed in the bezel, the second pin is connected and fastened to the bezel, and the connecting rib is connected between the first pin part and the bezel;
fastening and connecting the circuit board to the lead frame, where the circuit board is correspondingly disposed in a hollow part in the lead frame, and the conductive connection end is correspondingly connected and fastened to the first pin part;
plastically packaging the circuit board and the first pin part, to form a packaging casing and obtain a packaged circuit board module; and
performing a cutting operation at positions of connecting ribs in pins in each frame unit, so that the plurality of pins are separated from the lead frame, to obtain a plurality of packaged integrated circuit boards.

A plastic packaging process is performed on the first pin part together with the circuit board, instead of connecting the first pin part in a conductive connection manner such as reflow soldering only after the circuit board is separately plastically packaged and is formed through cutting. Therefore, connection fastness between the first pin part and the conductive connection pad in the circuit board is improved, and safety and reliability of the circuit board are improved.

The electronic components are disposed on each of the first base surface and the second base surface that are opposite in the first base board, so that plastic packaging of a dual-sided circuit board can be implemented, thereby effectively improving integration of a packaged circuit board.

In an embodiment of this application, the plurality of conductive connection ends are disposed on at least one side of the first base board. In addition, at least one electronic component and conductive line of the first base board are exposed on two opposite sides of the lead frame from the hollow part.

In an embodiment of this application, the circuit board is a power circuit board, and the power circuit board is configured to perform functions such as power conversion, distribution, and detection, and other power management and control.

In an embodiment of this application, the circuit board is a microprocessor circuit board, a central processing unit circuit board, a graphics processing unit circuit board, a baseband circuit board, or the like.

In an embodiment of this application, the connecting rib includes a horizontal rib, reinforcing ribs, and auxiliary ribs, the horizontal rib is connected to the second pin part of each pin and the bezel, the reinforcing rib is connected to the horizontal rib and the bezel, and the auxiliary rib is connected to the horizontal rib and the first pin part.

The step of performing a cutting operation at positions of connecting ribs in pins further includes:
performing cutting at a connection position between the second pin part and the bezel, and breaking a connection between the second pin part and the bezel;
performing cutting between the plurality of pins and the horizontal rib, and breaking connections between the plurality of pins and the horizontal rib; and
performing cutting on the auxiliary rib, and breaking connections between the plurality of pins in each frame unit and the bezel.

When the horizontal rib and the plurality of pins are cut from the bezel, the auxiliary rib is still connected to the pin, thereby effectively preventing the pin from being damaged when the pin is cut from the horizontal rib.

In an embodiment of this application, after cutting is performed at the connection position between the second pin part and the bezel and cutting is performed between the plurality of pins and the horizontal rib, the second pin part is bent by a first angle relative to the first pin part, and cutting is performed on the auxiliary rib. After the horizontal rib and the plurality of pins are cut from the bezel, the auxiliary rib is still connected to the pin, and then when the second pin part is bent, the auxiliary rib can assist in completing automatic bending of the second pin part, and can effectively prevent the pin from being damaged during bending, thereby improving safety and reliability of the packaged integrated circuit board.

In an embodiment of this application, the first pin part includes a first penetration hole that penetrates through the first pin in a direction perpendicular to the first base board, and the first penetration hole is configured to accommodate a conductive connection agent. The step of fastening and connecting the circuit board to the lead frame includes:

coating, with the conductive connection agent, a position that is in the first pin part and that corresponds to the first penetration hole; and after the plurality of conductive connection pads are correspondingly aligned with a plurality of first pin parts, electrically fastening and electrically connecting the plurality of conductive connection pads to the plurality of first pin parts in a one-to-one manner by using the conductive connection agent.

After the first pin part is electrically connected to the conductive connection pad in the circuit board by using the conductive connection agent, the plastic packaging process is performed on the first pin part together with the circuit board, thereby ensuring connection fastness between the first pin part and the conductive connection pad in the circuit board.

In an embodiment of this application, the first pin part includes a boss, a recessed part, and a second penetration hole. The boss is disposed on the first pin part in a direction perpendicular to the first pin part. Corresponding to a position of the boss, the first pin part further includes the recessed part recessed in the direction perpendicular to the first base board. The recessed part and the boss are located on a same straight line in the first direction. The second penetration hole penetrates through the recessed part in the direction perpendicular to the first base board. The recessed part and the second penetration hole are configured to accommodate a plastic packaging material. The step of plastically packaging the circuit board includes:

plastically packaging the circuit board and the first pin part by using the plastic packaging material in a direction adjacent to the first base surface and a direction adjacent to the second base surface, and forming a packaging casing on the first base surface, the second base surface, and the plurality of first pin parts, where a contact area and a binding force between the first pin part and the plastic packaging material are increased by using the boss, the recessed part, and the second penetration hole, the packaging casing covers the circuit board and the first pin part in two opposite directions of a corresponding hollow part in each frame unit, and all parts of the lead frame except the first pin part are exposed outside the packaging casing.

The first base surface and the second base surface that are opposite and on each of which the electronic components are disposed in the first base board are simultaneously plastically packaged in two directions, thereby effectively improving plastic packaging efficiency.

In an embodiment of this application, after the circuit board is plastically packaged, the method further includes: electroplating the second pin part, to protect the second pin part from being corroded or worn.

In an embodiment of this application, after the circuit board is plastically packaged, the method further includes: grinding the packaging casing at a position of at least one electronic component in the circuit board, where the at least one electronic component is exposed from the packaging casing, thereby improving heat dissipation efficiency of the electronic component.

In an embodiment of this application, a lead frame applied to a circuit board packaging manner is provided. The lead frame includes a plurality of frame units disposed in parallel in a first direction. The frame unit includes a hollow bezel, and a plurality of pins and connecting ribs that are disposed in the bezel. Each pin includes a first pin part and a second pin part that extend in a second direction and that are integrally formed, the first pin part is disposed in the bezel, the first pin part is configured to be electrically connected to a circuit board, and the second pin is connected and fastened to the bezel. The second direction is perpendicular to the first direction. The connecting rib is connected between the first pin part and the bezel.

When the lead frame is applied to a plastic packaging process of the circuit board, after the first pin part is electrically connected to a conductive connection pad in the circuit board by using a conductive connection agent, a plastic packaging process is performed on the first pin part together with the circuit board, thereby ensuring connection fastness between the first pin part and the conductive connection pad in the circuit board, so that safety and reliability of an electrical connection are improved when the circuit board is connected to another conductive circuit. In addition, during plastic packaging, only a corresponding circuit board and first pin part in each frame unit need to be plastically packaged, without a need to plastically package other parts in the lead frame, thereby effectively saving a plastic packaging material and reducing plastic packaging difficulty.

In an embodiment of this application, the bezel is rectangular, and includes two oppositely disposed first arms and two oppositely disposed second arms, the plurality of pins are disposed in parallel in a direction parallel to the second arm, and an extension direction of the plurality of pins is parallel to the first arm. The first arm extends in the second direction, and the second arm extends in the first direction, so that the plurality of pins are disposed in parallel in the first direction and extend in the second direction.

The connecting rib includes a horizontal rib, reinforcing ribs, and auxiliary ribs, the horizontal rib is connected to the first pin part of each pin and the bezel, the reinforcing rib is connected to the horizontal rib and the bezel, and the auxiliary rib is connected to the horizontal rib and the first pin part. Disposition of the connecting rib effectively improves connection strength between the pin and the bezel, and ensures safety of the pin in packaging and cutting processes.

In an embodiment of this application, the first pin part includes a first penetration hole that penetrates through the first pin in a third direction, the first penetration hole is configured to accommodate a conductive connection agent, and the third direction is perpendicular to a plane on which the first direction and the second direction are located. The first penetration hole can accommodate a relatively large quantity of conductive connection agents, so that the first pin part can be reliably electrically connected to another conductive connection part.

In an embodiment of this application, the first pin part includes a boss, the boss is connected to the first pin part in a direction perpendicular to an extension direction of the first pin part, the first pin part further includes a recessed part recessed in the third direction, and the recessed part and the boss are located on a same straight line in the first direction. The recessed part includes a second penetration hole, the second penetration hole penetrates through the recessed part in the third direction, and the second penetration hole is configured to accommodate a plastic packaging material. The recessed part, the boss, and the second penetration hole cooperate to effectively increase a contact area of the first pin part with the plastic packaging material in a subsequent plastic packaging process, improve a binding force between the first pin part and the plastic packaging material, and enhance plastic fastness.

In an embodiment of this application, a packaged integrated circuit board is provided. The packaged integrated circuit board includes a first base board, a plurality of pins, and a packaging casing. The first base board includes a first base surface and a second base surface that are oppositely disposed. A plurality of electronic components, a plurality of conductive lines, and a plurality of conductive connection pads are disposed on each of the first base surface and the second base surface, and the plurality of electronic components are electrically connected to the plurality of conductive connection pads through the plurality of conductive lines. The plurality of pins include first pin parts and second pin parts, and the first pin parts in the plurality of pins are electrically connected to the plurality of conductive connection pads in a one-to-one manner by using a conductive connection agent. The packaging casing is formed by plastically packaging the first base board and the first pin part by using a plastic packaging material after the plurality of pins are electrically connected to the plurality of conductive connection pads by using the conductive connection agent, and the second pin part is exposed outside the packaging casing.

After the first pin part is electrically connected to the conductive connection pad in a circuit board by using the conductive connection agent, a plastic packaging process is performed on the first pin part together with the circuit board, thereby ensuring connection fastness between the first pin part and the conductive connection pad in the circuit board, so that safety and reliability of an electrical connection are improved when the circuit board is connected to another conductive circuit. In addition, the electronic components are disposed on each of the first base surface and the second base surface that are opposite in the first base board, so that plastic packaging of a dual-sided circuit board can be effectively implemented, thereby effectively improving integration of the circuit board.

In an embodiment of this application, the circuit board is a power circuit board, and the power circuit board is configured to perform functions such as power conversion, distribution, and detection, and other power management and control. Correspondingly, the packaged integrated circuit board is a power chip.

In an embodiment of this application, the packaged integrated circuit board is a microprocessor, a central processing unit, a graphics processing unit, a baseband chip, a system on chip, or the like.

In an embodiment of this application, the first pin part and the second pin part extend in a same direction and are integrally formed. In a plurality of pins disposed in parallel on one side of the packaged integrated circuit board, auxiliary ribs in the foregoing connecting rib are disposed at first pin parts of pins arranged at the first position and the last position. The auxiliary rib can effectively protect safety of the pin in packaging, cutting, and bending processes.

In an embodiment of this application, the first pin part includes a first penetration hole that penetrates through the first pin in a direction perpendicular to the first base surface, and a conductive connection agent is accommodated in the first penetration hole, so that the first pin part can be reliably electrically connected to the conductive connection pad.

In an embodiment of this application, the first pin part further includes a boss. The boss is connected to the first pin part in a direction perpendicular to the first pin part. Corresponding to a position of the boss, the first pin part further includes a recessed part recessed in the direction perpendicular to the first base surface. The recessed part is configured to accommodate a plastic packaging material. The recessed part and the boss are located on a same straight line in a first direction. Corresponding to the recessed part, the first pin part includes a second penetration hole, the second penetration hole penetrates through the recessed part in the direction perpendicular to the first base surface, and the second penetration hole is configured to accommodate the plastic packaging material. The recessed part, the boss, and the second penetration hole cooperate to effectively increase a contact area of the first pin part with the plastic packaging material in a subsequent plastic packaging process, improve a binding force between the first pin part and the plastic packaging material, and enhance plastic fastness.

In an embodiment of this application, at least one of the plurality of electronic components is exposed from the packaging casing, thereby improving heat dissipation efficiency of the electronic component.

In an embodiment of this application, a power chip is provided. The power chip includes a first base board, a plurality of pins, and a packaging casing. The first base board includes a first base surface and a second base surface that are opposite, a plurality of electronic components, a plurality of conductive lines, and a plurality of conductive connection pads are disposed on each of the first base surface and the second base surface, the plurality of electronic components are electrically connected to the plurality of conductive connection pads through the plurality of conductive lines, and the plurality of electronic components cooperate with the plurality of conductive lines to perform power conversion, distribution, and detection. Each of the plurality of pins includes a first pin part and a second pin part, and first pin parts in the plurality of pins are electrically connected to the plurality of conductive connection pads in a one-to-one manner by using a conductive connection agent. The packaging casing is formed by plastically packaging a circuit board and the first pin part by using a plastic packaging material after the plurality of pins are connected to the plurality of conductive connection pads, and the second pin part is exposed outside the packaging casing.

DESCRIPTION OF EMBODIMENTS

Figure 1:
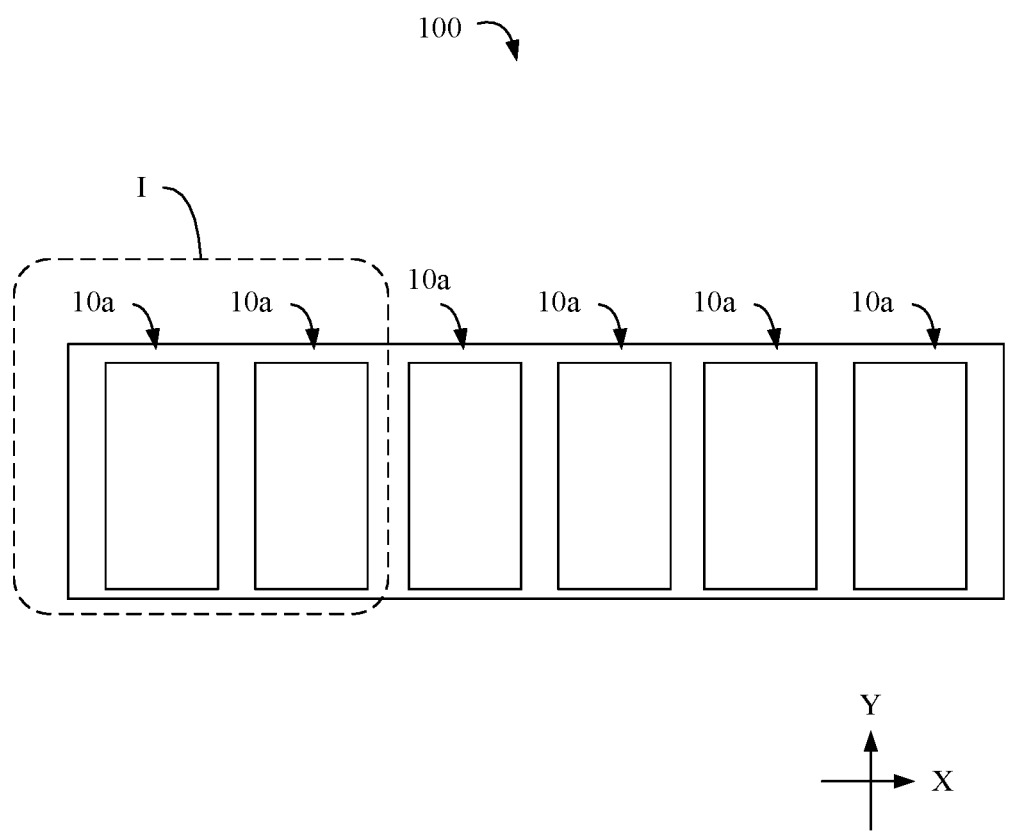
FIG. 1 is a schematic diagram of a planar structure of a lead frame according to an embodiment of this application.

FIG. 1 is a schematic diagram of a planar structure of a lead frame 100 according to an embodiment of this application.

As shown in FIG. 1, the lead frame 100 includes a plurality of frame units 10a, and the plurality of frame units 10a are disposed in parallel in a first direction X. In this embodiment, the lead frame 100 is applied to an integrated packaging process of a circuit board, to perform, together with a circuit board (refer to FIG. 6), a packaging process on a pin (refer to FIG. 2) that performs a conductive connection.

Figure 2:
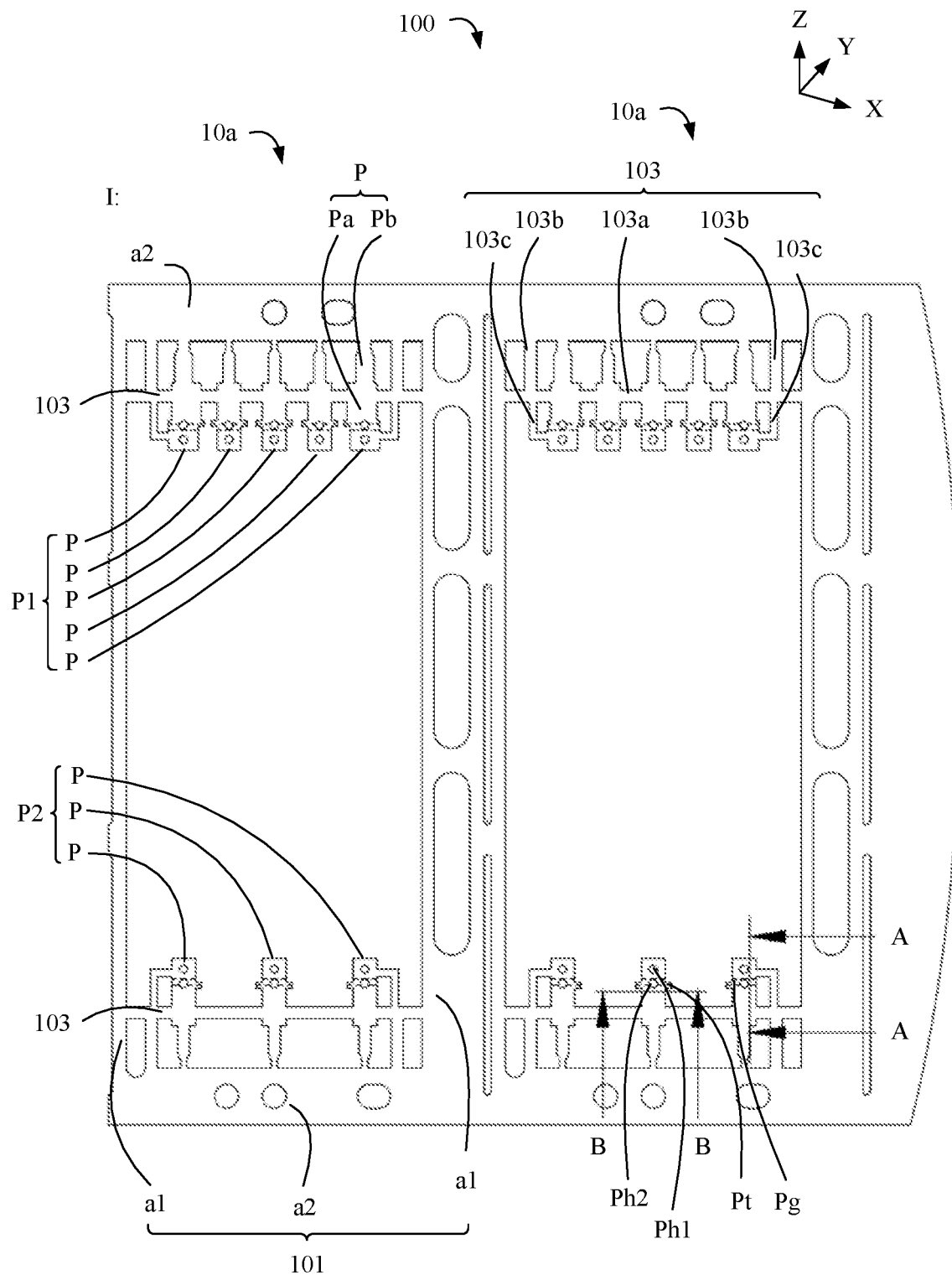
FIG. 2 is a schematic diagram of a partially enlarged structure, of the lead frame shown in FIG. 1, along a line I.

FIG. 2 is a schematic diagram of a partially enlarged structure, of the lead frame 100 shown in FIG. 1, along a line I. As shown in FIG. 2, each frame unit 10a includes a hollow bezel 101, a plurality of pins P, and connecting ribs 103. The plurality of pins P and the connecting ribs 103 are located in a hollow part in the bezel 101. The connecting ribs 103 are connected between the plurality of pins P and the bezel 101, and are configured to fasten and connect the plurality of pins P to the bezel 101.

Specifically, the bezel 101 includes oppositely disposed first arms a1 and second arms a2, and a length of the first arm a1 is greater than a length of the second arm a2. The two first arms a1 extend in a second direction Y and are disposed at an interval of a preset distance in the first direction X, and the second arms a2 extend in the first direction X and are disposed at an interval of a preset distance in the second direction Y. Therefore, the two first arms a1 and the two second arms a2 are spaced apart from each other and connected end to end to form a hollow rectangular structure. In other embodiments of this application, a length of the first arm a1 is different from a length of the second arm a2, in other words, the bezel 101 is of a hollow square structure. In this embodiment, the first direction X, the second direction Y, and a third direction Z are perpendicular to each other and form three-dimensional coordinates. It should be noted that arrows in the first direction X, the second direction Y, and the third direction Z all represent positive/negative directions of the directions.

The plurality of pins P extend in the second direction Y and are disposed in parallel in a hollow region in the frame 101 in the first direction X, and the plurality of pins P are connected to the second arms a2 in a direction perpendicular to an extension direction of the second arm a2. That is, an extension direction of the plurality of pins P is parallel to an extension direction of the first arm a1, an arrangement direction of the plurality of pins P is parallel to the second arm a2, and the plurality of pins P are adjacent to the two second arms a2 and are fastened and connected to the second arms a2 through abutting.

In this embodiment, the plurality of pins P include a first pin group P1 and a second pin group P2, the first pin group P1 is connected to one second arm a2, and the second pin group P2 is connected to the other second arm a2.

Specifically, each of the plurality of pins P includes a first pin part Pa and a second pin part Pb that extend in the second direction Y and that are integrally formed. The first pin part Pa is disposed at a hollow position in the bezel 101, and the first pin part Pa is configured to be electrically connected to a circuit board (not shown in the figure). That is, the first pin Pa is disposed in the hollow region in the bezel 101 through suspending. The second pin part Pb is connected to the second arm a2, so that the second pin part Pb is configured to be connected to another conductive line other than the circuit board. Therefore, the circuit board is electrically connected to the another conductive line by using the plurality of pins P. In this embodiment, a width size of the first pin part Pa in the first direction X is greater than a width size of the second pin part Pb in the first direction X. The first pin part Pa is an internal pin, and the second pin part Pb is an external pin.

Figure 3:
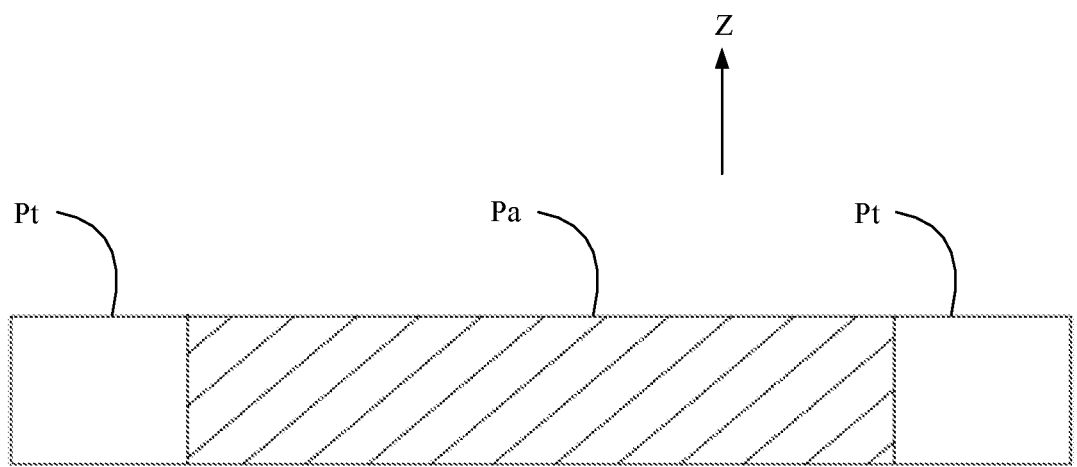
FIG. 3 is a schematic diagram of a cross-sectional structure along a line A-A in the lead frame shown in FIG. 2.
Figure 4:
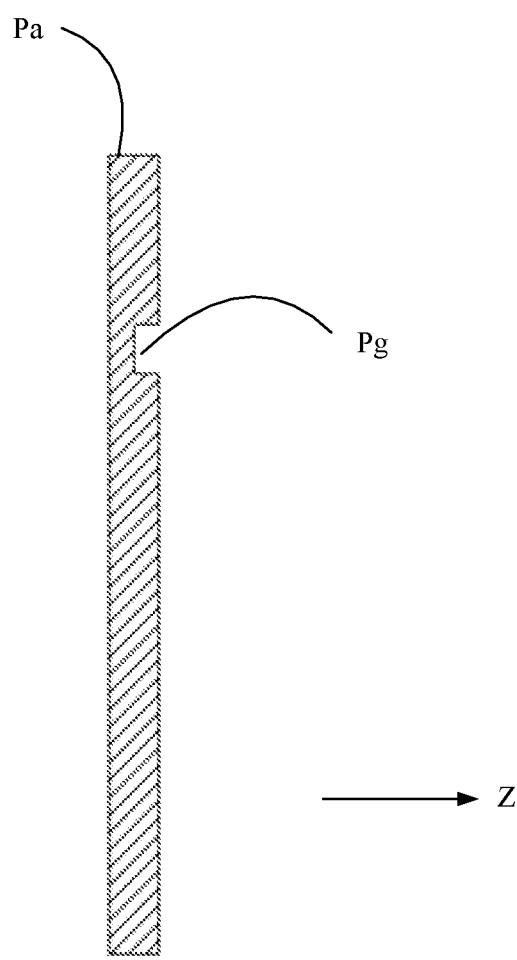
FIG. 4 is a schematic diagram of a cross-sectional structure along a line B-B in the lead frame shown in FIG. 2.

FIG. 3 is a schematic diagram of a cross-sectional structure along a line A-A in the lead frame shown in FIG. 2. FIG. 4 is a schematic diagram of a cross-sectional structure along a line B-B in the lead frame shown in FIG. 2.

As shown in FIG. 2, the first pin part Pa includes a first penetration hole Ph1 that penetrates through the first pin part Pa in the third direction Z, and the first penetration hole Ph1 is configured to accommodate a conductive connection agent, so that the first pin part Pa can be reliably electrically connected to another conductive connection part. The third direction Z is perpendicular to a plane in which the first direction X and the second direction Y are located. In this embodiment, the plane defined by the first direction X and the second direction Y is parallel to a plane in which the frame is located, and the third direction Z is a thickness direction of the pin P.

As shown in FIG. 2 and FIG. 4, the first pin part Pa further includes a boss Pt. The boss Pt is disposed by extending from the first pin part Pa in the first direction X. That is, the boss Pt is perpendicular to the first pin part Pa and is disposed on the first pin part Pa through protrusion.

Corresponding to a position of the boss Pt, the first pin part Pa further includes a recessed part Pg recessed in the third direction Z and a second penetration hole Ph2 that penetrates through the recessed part Pg in the third direction Z, and the recessed part Pg and the second penetration hole Ph2 are configured to accommodate a plastic packaging material. The boss Pt and the recessed part Pg are substantially located on a same straight line in the first direction X. In other words, the boss Pt and the recessed part Pg are disposed in parallel in the first direction X. The first penetration hole Ph1 and the second penetration hole Ph2 are also located on a same straight line parallel to the second direction Y. In other words, the first penetration hole Ph1 and the second penetration hole Ph2 are disposed in parallel in the second direction Y. In this embodiment, the recessed part Pg does not penetrate through the first pin part Pa, and the recessed part Pg is formed by half etching the first pin Pa. For example, a recession dimension of the recessed part Pg is 50% of an overall thickness of the first pin part Pa.

In this embodiment, the recessed part Pg, the boss Pt, and the second penetration hole Ph2 cooperate to effectively increase a contact area of the first pin part Pa with the plastic packaging material in a subsequent plastic packaging process, improve a binding force between the first pin part Pa and the plastic packaging material, and enhance plastic fastness.

Refer to FIG. 2 again. One connecting rib 103 is correspondingly disposed for each pin group. For example, for the first pin group P1, a connecting rib 103 is connected to a plurality of pins P and the first arms a1 and a second arm a2 in the frame 101 and is configured to fasten the plurality of pins P to the hollow part in the frame 101.

Specifically, as shown in FIG. 2, the connecting rib 103 includes a horizontal rib 103a, reinforcing ribs 103b, and auxiliary ribs 103c.

The horizontal rib 103a is disposed by extending in the first direction X, is connected to a first pin part Pa of each of the plurality of pins P and the two oppositely disposed first arms a1, and is configured to fasten and connect the plurality of pins P to the frame 101 in the first direction X.

In other embodiments of this application, the horizontal rib 103a may be alternatively connected to each pin P in a non-perpendicular manner. For example, the horizontal rib 103a may be connected to the pin P in an acute angle or an obtuse angle manner.

The reinforcing rib 103b is disposed by extending in the second direction Y and is connected between the horizontal rib 103a and the second arm a2. In this embodiment, two reinforcing ribs 103b are correspondingly included for one pin group P1 or one pin group P2. The two reinforcing ribs 103b are separately disposed adjacent to the two first arms a1, in other words, disposed between the pin group P1 or the pin group P2 and the two first arms a1. That is, in a plurality of pins P disposed in parallel on one side of each frame unit 10a in the lead frame 100, reinforcing ribs 103b are disposed between pins P arranged at the first position and the last position and the first arms a1. The reinforcing rib 103b is configured to fasten the horizontal rib 103a to the second arm a2, to enhance connection strength between the pin P and the frame 101, and prevent the pin P from falling off from the frame 101.

The auxiliary rib 103c includes two parts (not marked) that extend in different directions, is connected between the horizontal rib 103a and the first pin part Pa, and is configured to enhance connection strength between the first pin part Pa and a circuit board in a circuit board packaging process.

In this embodiment, the auxiliary rib 103c includes two parts that are perpendicular to each other, and a connecting rib 103 corresponding to one pin group includes two auxiliary ribs 103c. The two auxiliary connecting ribs 103c are respectively disposed at first pin parts Pa of pins P arranged at the first position and the last position in one pin group.

That is, in a plurality of pins P disposed in parallel on one side of each frame unit 10a in the lead frame 100, connecting ribs 103c are disposed between first pin parts Pa of pins P arranged at the first position and the last position and the horizontal rib 103a.

Figure 5:
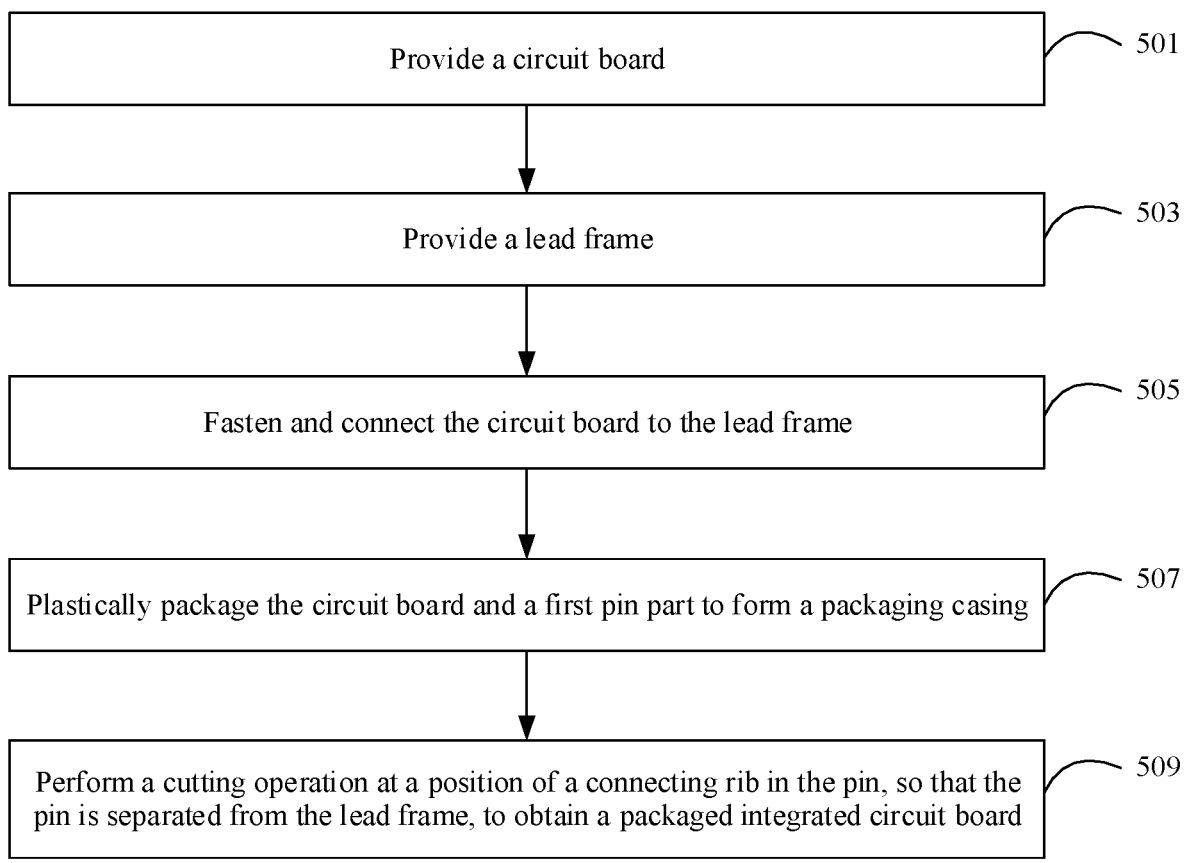
FIG. 5 is a flowchart of a method for packaging a circuit board by using the lead frame shown in FIG. 1 and FIG. 2.

FIG. 5 is a flowchart of a method for packaging a circuit board by using the lead frame 100 shown in FIG. 1 and FIG. 2.

As shown in FIG. 5, the packaging method includes the following steps:

Step 501: Provide a circuit board 200.

Figure 6:
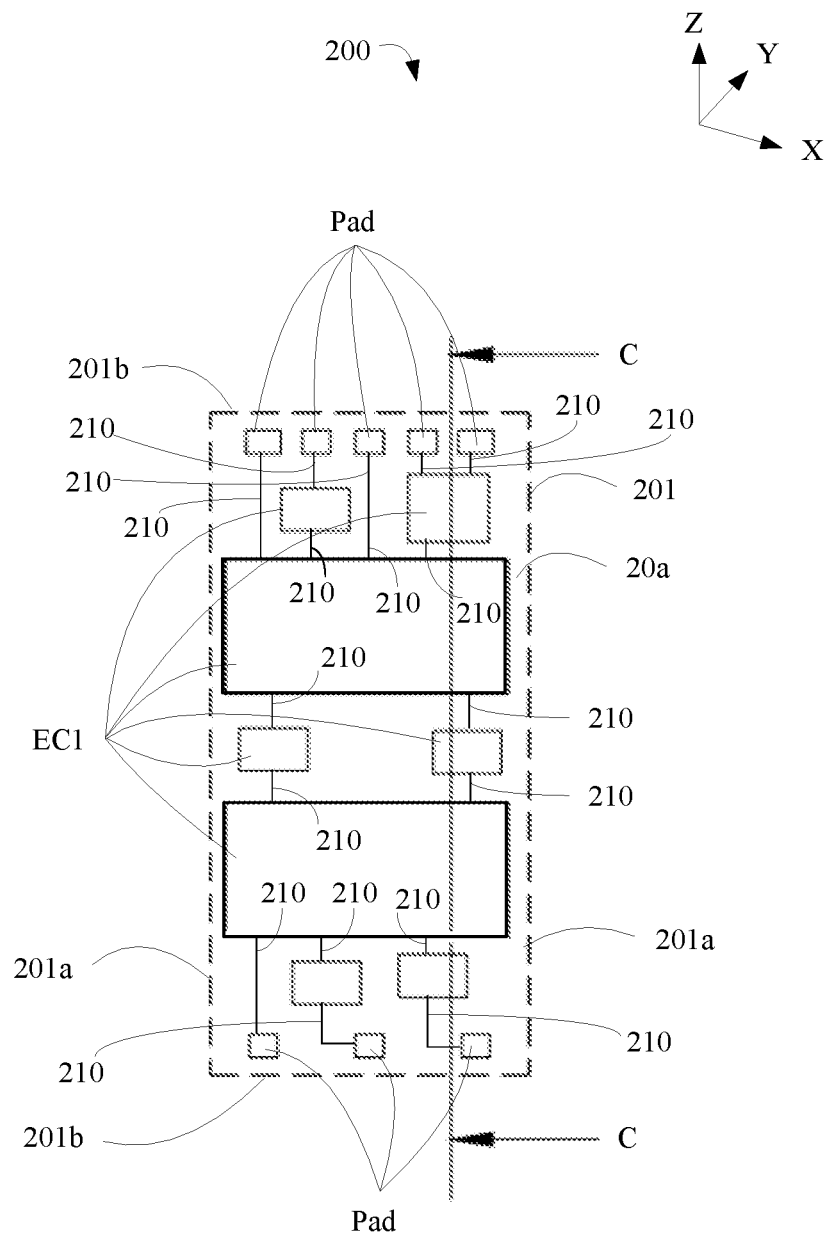
FIG. 6 is a schematic diagram of a planar structure of a circuit board.
Figure 7:
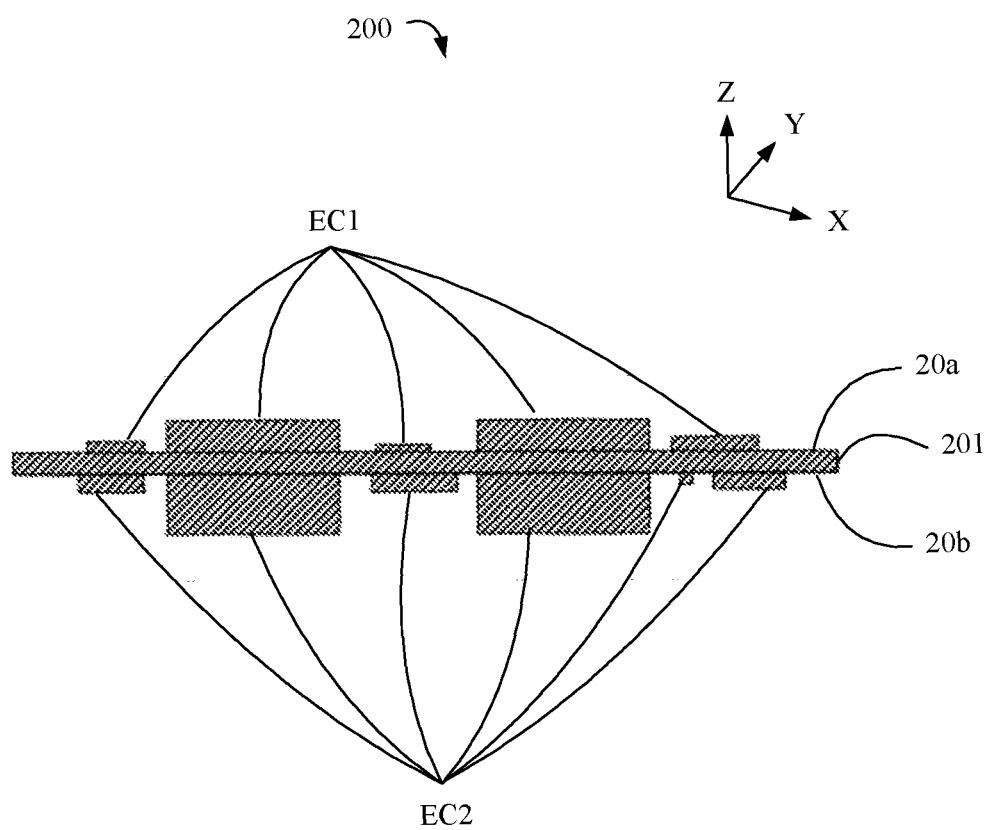
FIG. 7 is a schematic diagram of a cross-sectional structure, of the circuit board shown in FIG. 6, along a line C-C.

FIG. 6 is a schematic diagram of a planar structure of the circuit board 200. FIG. 7 is a schematic diagram of a cross-sectional structure, of the circuit board 200 shown in FIG. 6, along a line C-C.

As shown in FIG. 6 and FIG. 7, the circuit board 200 includes a first base board 201, the first base board 201 includes a first base surface 20a and a second base surface 20b that are opposite, and a plurality of electronic components, a plurality of conductive lines 210, and a plurality of conductive connection pads (Pads) are disposed on each of the first base surface 20a and the second base surface 20b. The first base surface 20a and the second base surface 20b are parallel to the plane defined by the first direction X and the second direction Y.

In this embodiment, the first base board 201 is a printed circuit board (PCB), and the plurality of electronic components may be components such as an integrated chip, a switching component, a resistor, a capacitor, and a magnetic core. The integrated chip may be a voltage conversion chip, a transformer chip, or the like. The plurality of electronic components are electrically connected through the plurality of conductive lines 210, and the plurality of electronic components are electrically connected to the plurality of conductive connection pads (Pads) through the plurality of conductive lines 210.

In an embodiment of this application, the circuit board 200 is a power circuit board, and the power circuit board is configured to perform functions such as power conversion, distribution, and detection, and other power management and control.

In other modified embodiments of this application, the circuit board 200 may be alternatively a microprocessor (Microcontroller Unit, MCU) circuit board, a central processing unit (CPU) circuit board, a graphics processing unit (GPU) circuit board, a baseband circuit board, or a system on chip (SoC) circuit board.

Specifically, the first base board 201 is rectangular as a whole, and includes two first side edges 201a and two second side edges 201b. The first side edge 201a extends in the second direction Y, the second side edge 201b extends in the second direction X, and a length of the first side edge 201 is greater than a length of the second side edge 201.

A first electronic component group EC1 is disposed on the first base surface 20a, and the first electronic component group EC1 correspondingly includes a plurality of different electronic components and conductive lines. The plurality of electronic components may be components such as an integrated chip, a resistor, and a capacitor.

A second electronic component group EC2 is disposed on the second base surface 20b, and the second electronic component group EC2 also correspondingly includes a plurality of different electronic components.

In this embodiment, the plurality of conductive connection pads Pads are disposed on edges of two opposite ends of the first base surface 20a. More specifically, the plurality of conductive connection pads Pads are disposed at positions that are in the first base surface 20a and that are adjacent to the second side edges 201b, and the two second side edges 201b correspond to different quantities of conductive connection pads Pads. The electronic components are disposed on each of the two opposite base surfaces of the first base board 201, so that plastic packaging of a dual-sided circuit board can be effectively implemented, thereby effectively improving integration of the circuit board 200.

In other embodiments of this application, when the two second side edges 201b correspond to different quantities of conductive connection pads Pads, one second side edge 201 may correspond to 0 conductive connection pads Pads, in other words, all the conductive connection pads Pads are disposed on the first base surface 20a corresponding to one second side edge 201.

In other modified embodiments of this application, the two second side edges 201b may correspond to a same quantity of conductive connection pads Pads, a same quantity of conductive connection pads Pads are separately disposed on three side edges of the first base surface 20a, not completely same quantities of conductive connection pads Pads are separately disposed on three side edges of the first base surface 20a, a same quantity of conductive connection pads Pads are separately disposed on the two first side edges 201a and the two second side edges 201b, or not completely same quantities of conductive connection pads Pads are separately disposed on the two first side edges 201a and the two second side edge 20b.

In other modified embodiments of this application, one or more conductive connection pads may also be disposed at positions that are in the second base surface 20b and that are adjacent to one or more side edges.

Figure 8:
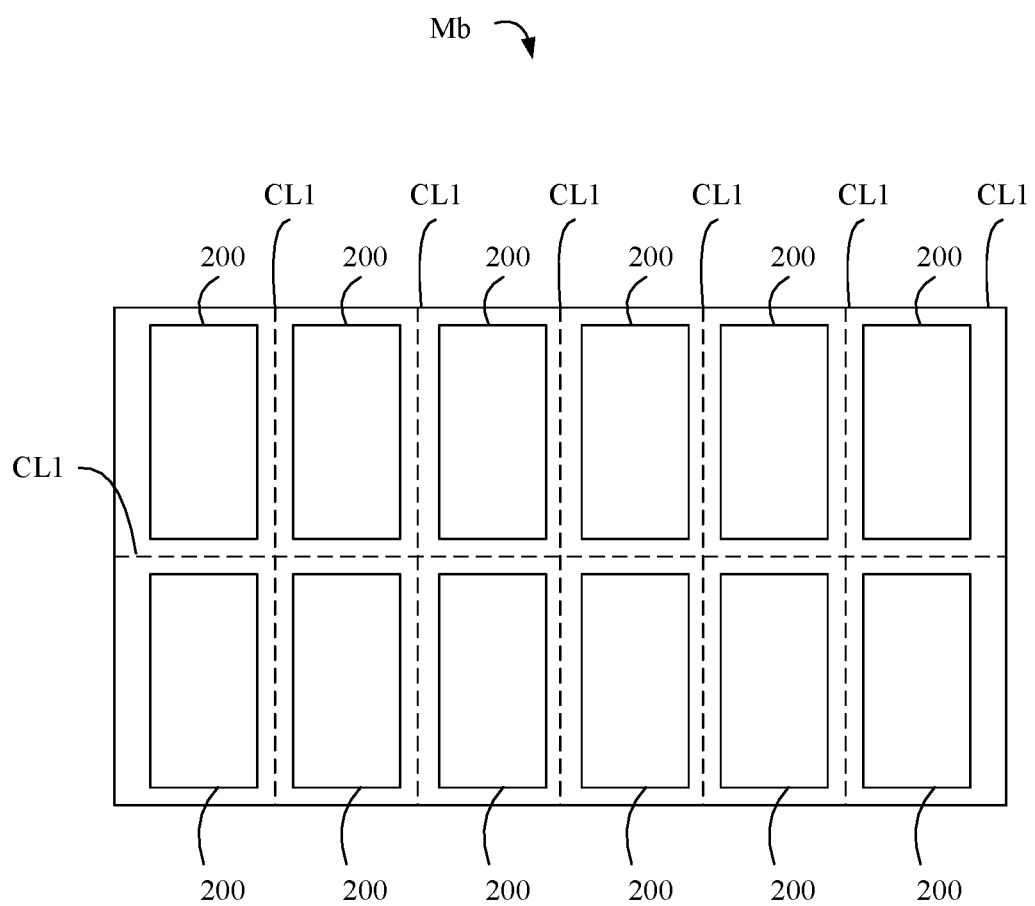
FIG. 8 is a schematic diagram of a planar structure of a first motherboard that includes a plurality of circuit boards.

In this embodiment, to obtain the circuit board 200 shown in FIG. 6 and FIG. 7, refer to FIG. 8. FIG. 8 is a schematic diagram of a planar structure of a first motherboard Mb that includes a plurality of circuit boards 200.

As shown in FIG. 8, the first motherboard Mb includes a plurality of circuit boards 200 arranged in a matrix. A first cutting line CL1 is disposed between adjacent circuit boards 200. The first motherboard Mb is cut along first cutting lines CL1, to obtain a plurality of individual circuit boards 200 shown in FIG. 6 to FIG. 7. Electronic components (not marked) and conductive connection pads Pads may be simultaneously disposed on the plurality of circuit boards 200 in the first motherboard Mb, and the electronic component may be mounted onto the first base board 201 by using a technology such as a surface mount technology (SMT).

Still refer to FIG. 5. In step 503, the lead frame 100 shown in FIG. 1 is provided. In this embodiment, the lead frame 100 is fastened to a process device (not shown in the figure).

Still refer to FIG. 5. In step 505, the circuit board 200 is fastened and connected to the lead frame 100.

Figure 9:
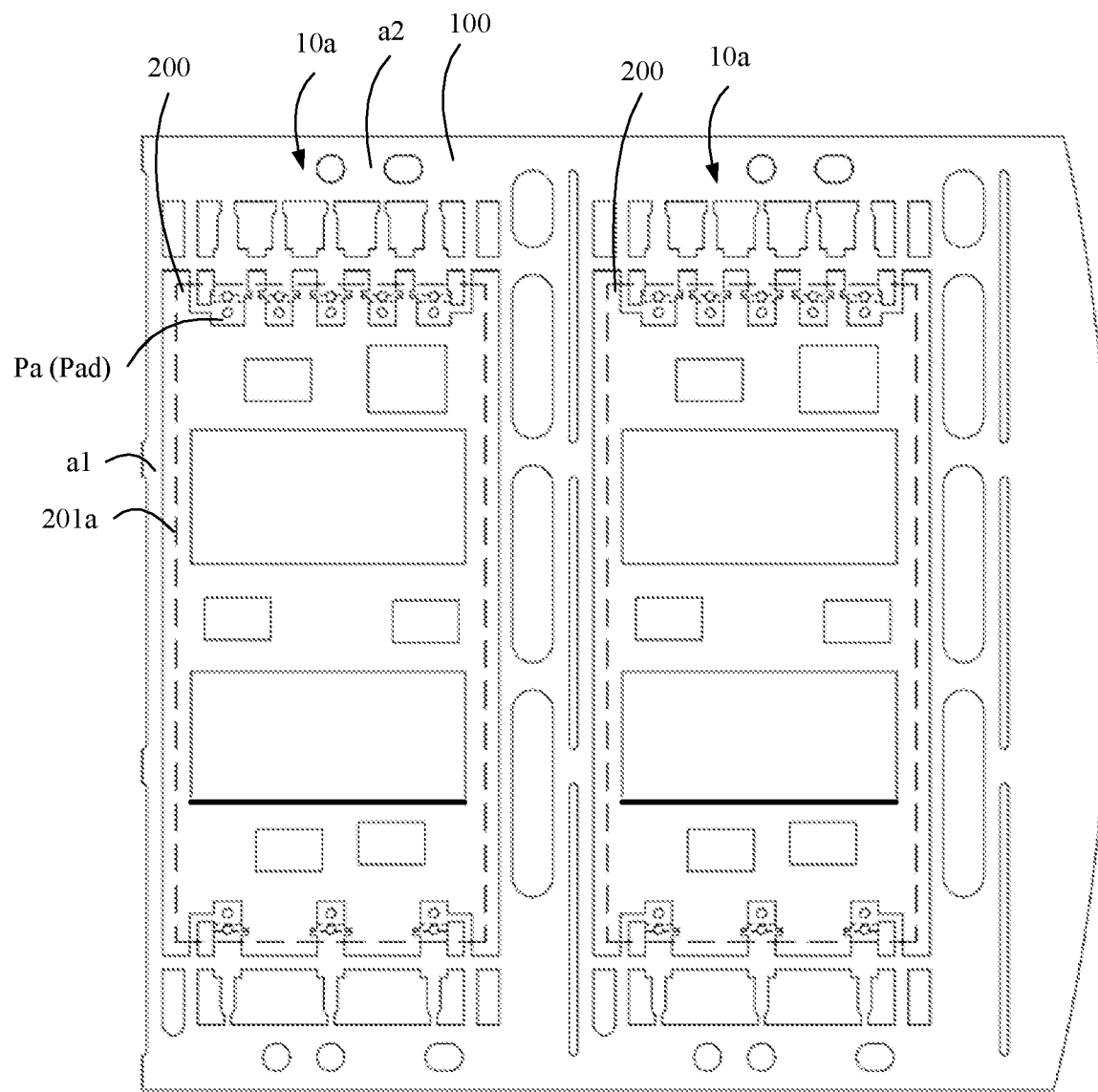
FIG. 9 is a schematic diagram of a planar structure obtained after a circuit board is fastened to a lead frame.

Specifically, refer to FIG. 9. FIG. 9 is a schematic diagram of a planar structure obtained after the circuit board 200 is fastened to the lead frame 100.

The circuit board 200 is aligned with a frame unit 10a in the lead frame 100, that is, one circuit board 200 is disposed through aligning with a hollow part in one frame unit 10a in the lead frame 100. More specifically, in the circuit board 200, the first side edge 201a corresponds to the first arm a1, the second side edge 201b corresponds to the second arm a2, and the plurality of conductive connection pads Pads are connected to a plurality of first pin parts Pa in a one-to-one manner by using the conductive connection agent, to implement an electrical connection and fastening between the plurality of conductive connection pads Pads and the plurality of first pin parts Pa.

In this embodiment, the conductive connection agent is solder, a position that is in the first pin part Pa and that corresponds to the first penetration hole Ph1 (FIG. 2) is coated with the conductive connection agent before the circuit board 200 is in contact with the lead frame, and the conductive connection agent is enabled to be in full contact with the first penetration hole Ph1 (FIG. 2), to help enhance connection strength between the first pin part Pa and the conductive connection pad Pad.

After the first pin part Pa of the frame unit 10a in the lead frame 100 is coated with the conductive connection agent, the plurality of circuit boards 200 are fastened to the lead frame 100 in a one-to-one correspondence manner between the plurality of conductive connection pads Pads of the circuit board 200 and the first pin parts Pa of the plurality of pins P. In this embodiment, a quantity of circuit boards 200 is the same as a quantity of frame units 10a, and circuit boards 200 are electrically connected and fastened to frame units 10a through aligning in a one-to-one manner.

After corresponding fastening to the lead frame 100 is completed, electronic components on the first base surface 20a and the second base surface 20b that are opposite and that are included in the first base board 201 are exposed outside the frame unit 10a in the lead frame 100 in two opposite directions of the hollow part in the lead frame 100, in other words, a plurality of electronic components and conductive lines on the first base board 201 are exposed on two opposite sides of the lead frame 100 from the hollow part in the lead frame 100.

Still refer to FIG. 5. In step 507, the circuit board 200 and the first pin part Pa are plastically packaged to form a packaging casing, to obtain a packaged circuit board module 300.

Figure 10:
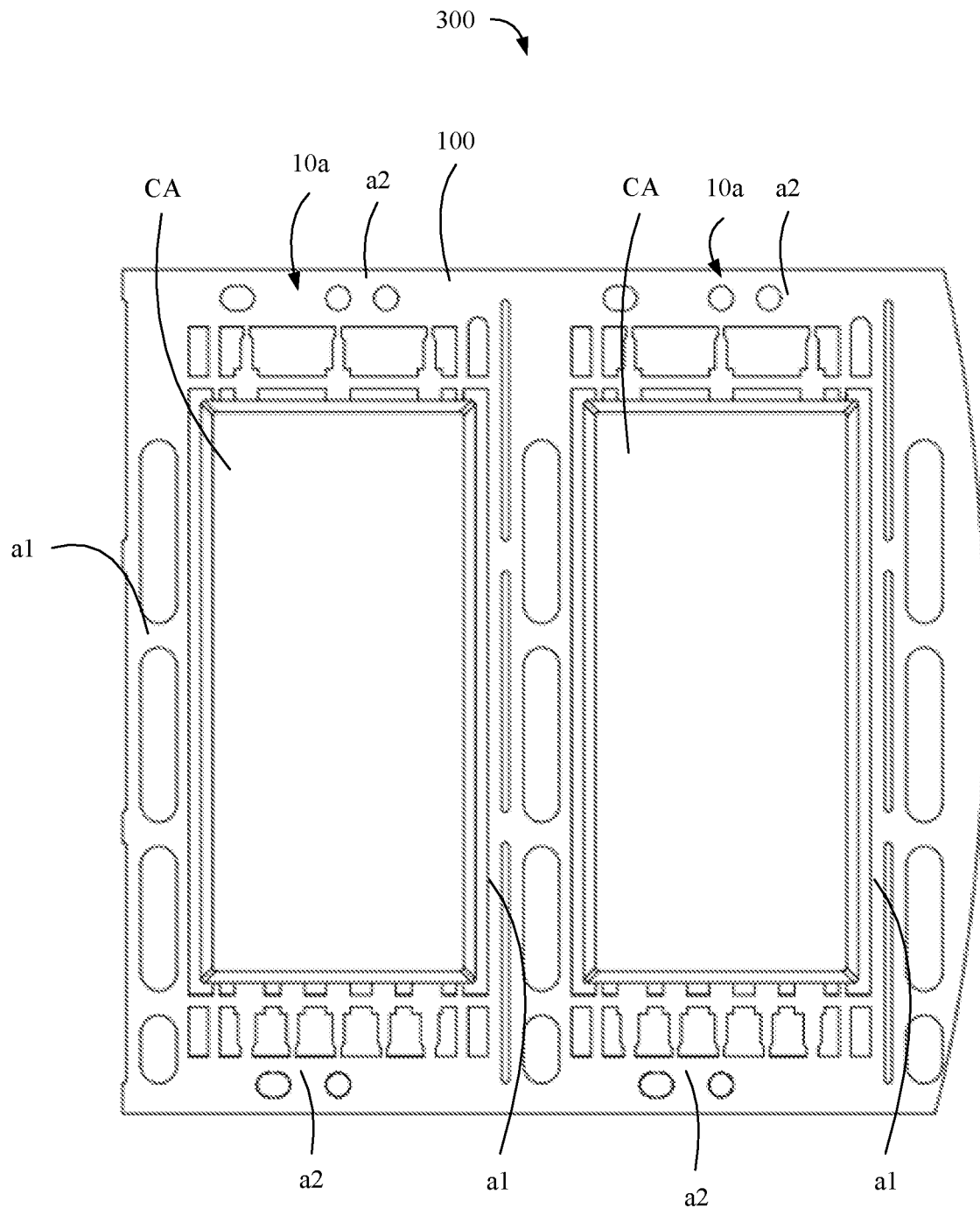
FIG. 10 is a schematic diagram of a planar structure of a packaged circuit board module obtained after a circuit board and a lead frame that complete fastening are plastically packaged.

Specifically, refer to FIG. 10. FIG. 10 is a schematic diagram of a planar structure of the packaged circuit board module 300 obtained after the circuit board 200 and the lead frame 100 that complete fastening are plastically packaged.

As shown in FIG. 10, corresponding to each frame unit 10a in the lead frame 100, the circuit board 200 (FIG. 7) and the first pin part Pa (FIG. 2) are plastically packaged with a mold by using a plastic packaging material in an injection molding manner in a direction adjacent to the first base surface 20a (FIG. 7) and a direction adjacent to the second base surface 20b (FIG. 7), in other words, the circuit board 200 is plastically packaged both in a positive direction and a negative direction of the third direction Z, so that the packaging casing CA is formed on the first base surface 20a and the second base surface 20b. In this embodiment, the plastic packaging material may be epoxy resin, an organosilicon rubber material, polyimide, fiber, metal, ceramic, or the like.

The packaging casing CA covers the circuit board 200 and the first pin part Pa (FIG. 2) in two opposite directions of the hollow part in the lead frame 100. In addition, in addition to the first pin part Pa, a frame including the first arms a1 and the second arms a2, the second pin part Pb, and the connecting rib 103 in the lead frame 100 are all exposed outside the packaging casing CA, to form the packaged circuit board module 300.

In this embodiment, the circuit board 200 is packaged by using a structure of the lead frame 200, so that only a corresponding circuit board 200 and first pin part Pa in each frame unit 10a need to be plastically packaged, without a need to plastically package a frame and a second pin part Pb in the lead frame 100, thereby effectively saving a plastic packaging material and reducing plastic packaging difficulty. In addition, after the first pin part Pa is electrically connected to the conductive connection pad Pad in the circuit board 200 by using the conductive connection agent, a plastic packaging process is performed on the first pin part Pa together with the circuit board 200, thereby ensuring connection fastness between the first pin part Pa and the conductive connection pad Pad in the circuit board 200, so that safety and reliability of an electrical connection are improved when the circuit board 200 is connected to another conductive circuit. In addition, the first base surface 20a and the second base surface 20b that are opposite and on each of which the electronic components are disposed in the first base board are simultaneously plastically packaged in two directions, thereby effectively improving plastic packaging efficiency.

In this embodiment, after the circuit board 200 is plastically packaged, the method further includes: performing an electroplating process on the second pin part Pa exposed outside the packaging casing CA, to protect the second pin part Pa from being corroded or worn. An electroplating material is tin. In other embodiments of this application, the electroplating material may be alternatively another material, such as gold, silver, aluminum, zinc, copper, chromium, nickel, or palladium. Certainly, the electroplating material is not limited thereto.

Still refer to FIG. 5. In step 509, a cutting operation is performed at a position of the connecting rib 103 in the pin P, so that the pin P is separated from the lead frame 100, to obtain a packaged integrated circuit board 400.

Figure 11:
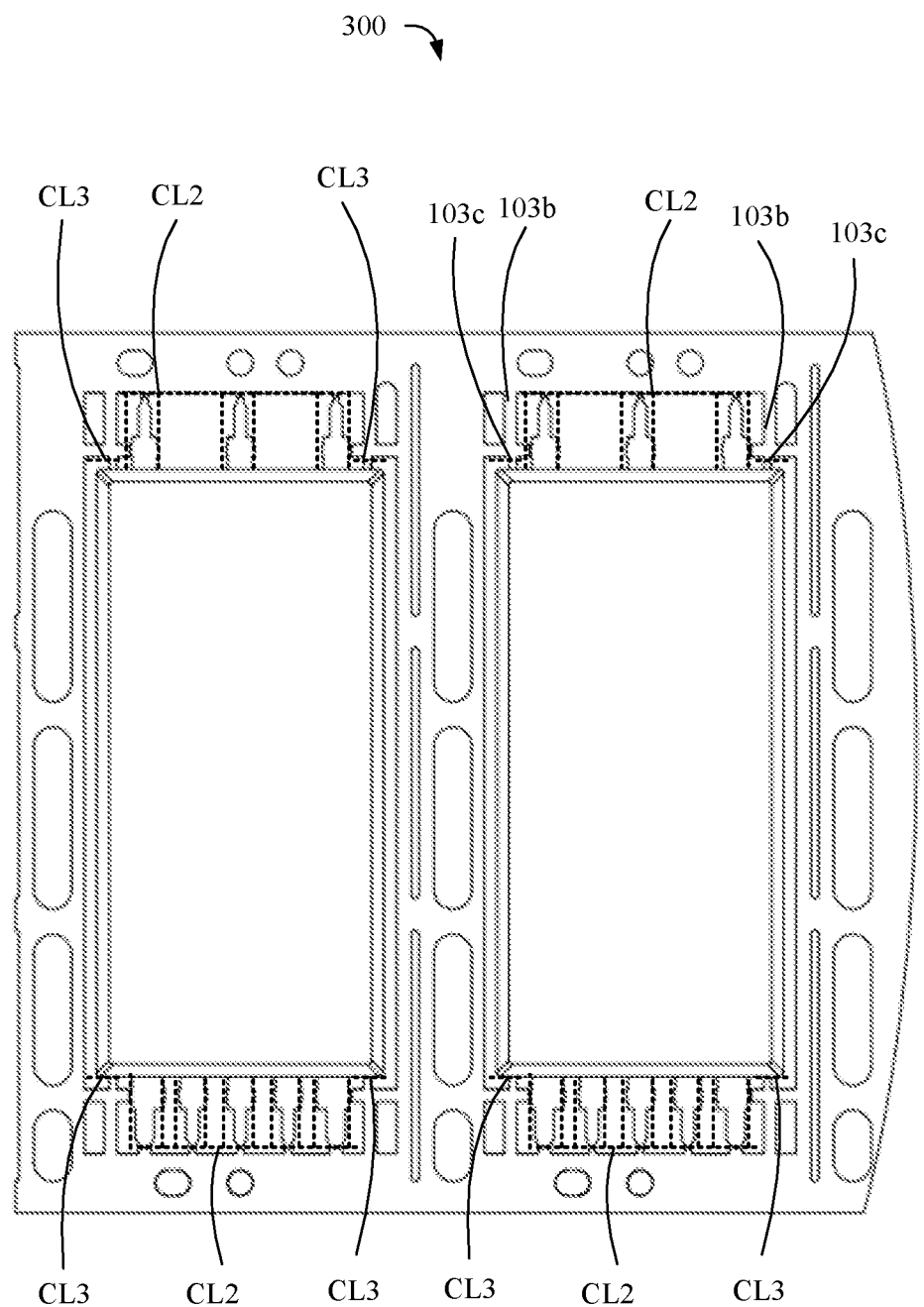
FIG. 11 is a schematic diagram of a planar structure for cutting a packaged circuit board module.

Specifically, refer to FIG. 11. FIG. 11 is a schematic diagram of a planar structure for cutting the packaged circuit board module 300. A cutting operation is performed between the second pin part Pb and the second arm a2 along a second cutting line CL2, and a connection between the second pin part Pb and the second arm a2 is broken, so that the second pin part Pb is disconnected from the second arm a2. In this embodiment, the second cutting line CL2 includes a plurality of line segments at different positions and in different directions.

Cutting is performed between the plurality of pins P and the horizontal rib 103a, and connections between the plurality of pins P and a connection between the pin P and the horizontal rib 103a are broken, so that the plurality of pins P are independent of each other without a connection relationship, and the pin P and the horizontal rib 103a are independent of each other without a connection relationship.

A cutting operation is performed on the auxiliary rib 103c along a third cutting line CL3, and a connection between the first pin part Pa and the horizontal rib 103a is broken, so that all the pins P are disconnected from the bezel 101 in the lead frame 100. In this case, a packaged circuit board 200 in the packaged circuit board module 300 is detached from the lead frame 100 with disconnection of the plurality of pins P from the bezel 101, to obtain a plurality of independent packaged integrated circuit boards 400 shown in FIG. 13.

In this embodiment, an angle between the first pin part Pa and the second pin Pb in the first pin P is 180°. In other words, the first pin part Pa and the second pin Pb are substantially located on a same straight line.

In this embodiment, when the horizontal rib 103a and the plurality of pins P are cut from the bezel 101, the auxiliary rib 103c is still connected to the pin P, thereby effectively preventing the pin P from being damaged when the pin P is cut from the horizontal rib 103a.

In this embodiment, when the corresponding circuit board 200 is a power circuit board, the packaged integrated circuit board 400 is a power chip.

In other modified embodiments of this application, when the circuit board 200 may be alternatively a microprocessor circuit board, a central processing unit circuit board, a graphics processing unit circuit board, a baseband circuit board, or a system on chip circuit board, the packaged integrated circuit board is a corresponding microprocessor, central processing unit, graphics processing unit, baseband chip, or system on chip.

Figure 12:
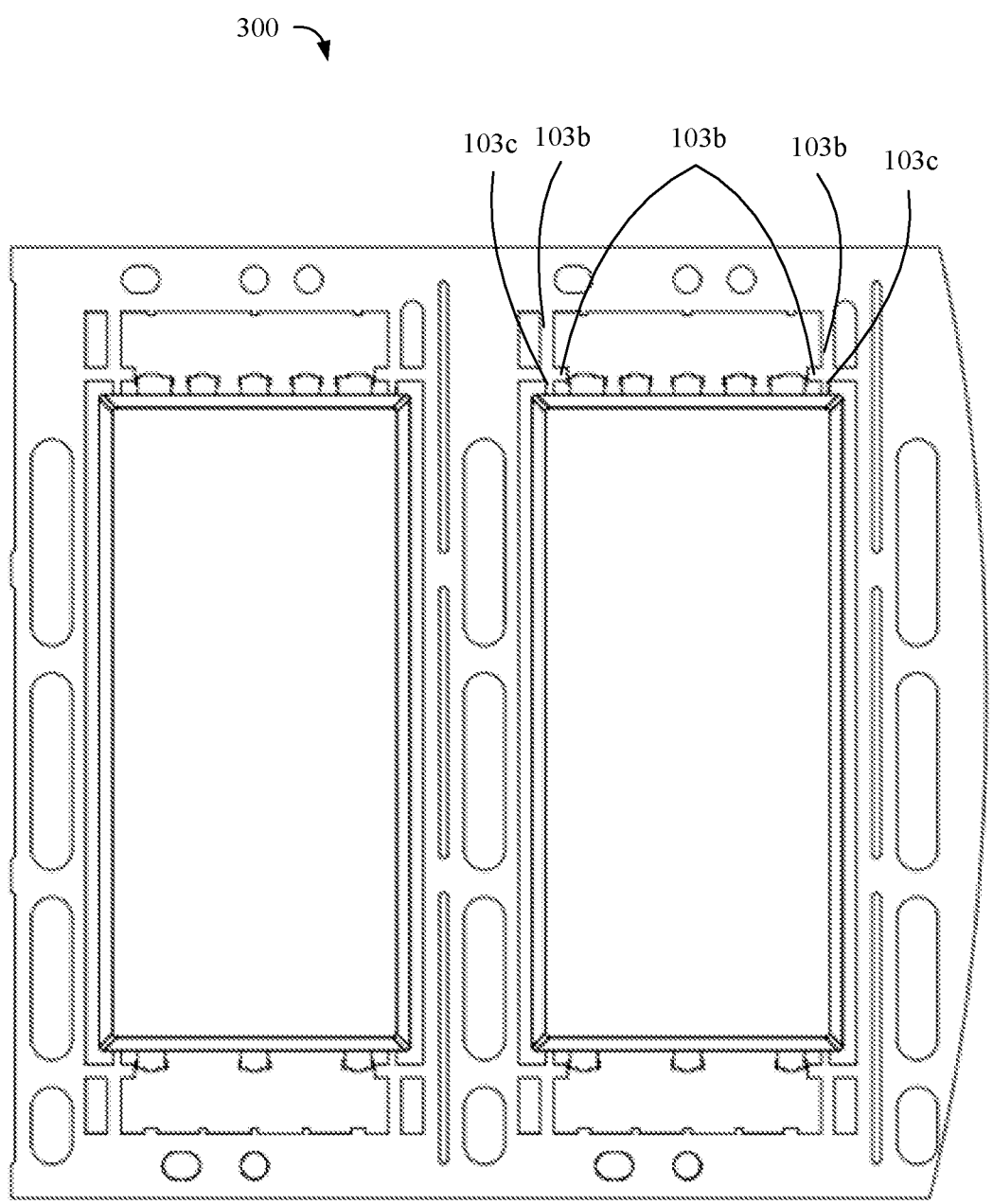
FIG. 12 is a schematic diagram of a planar structure obtained after a packaged circuit board module is cut and a pin is bent according to a second embodiment of this application.

FIG. 12 is a schematic diagram of a planar structure obtained after the packaged circuit board module 300 is cut and a pin is bent according to a second embodiment of this application.

Refer to FIG. 11 and FIG. 12 together. Cutting is performed between the second pin part Pb and the second arm a2 along a second cutting line CL2, and connections between the plurality of pins P and a connection between the pin P and the connecting rib 103 are broken, so that the second pin part Pb is disconnected from the second arm a2.

In addition, cutting is performed between the plurality of pins P and the horizontal rib 103a, and a connection between the first pin part Pa and the horizontal rib 103a is broken, so that the plurality of pins P are independent of each other without a connection relationship, and the pin P and the horizontal rib 103a are independent of each other without a connection relationship.

Further, the second pin part Pb is bent by a first angle at a position in which the first pin part Pa is adjacent to the second pin part Pb, in other words, the second pin part Pb is enabled to be substantially perpendicular to the first pin part Pa. In this embodiment, the first angle is 90°.

Figure 13:
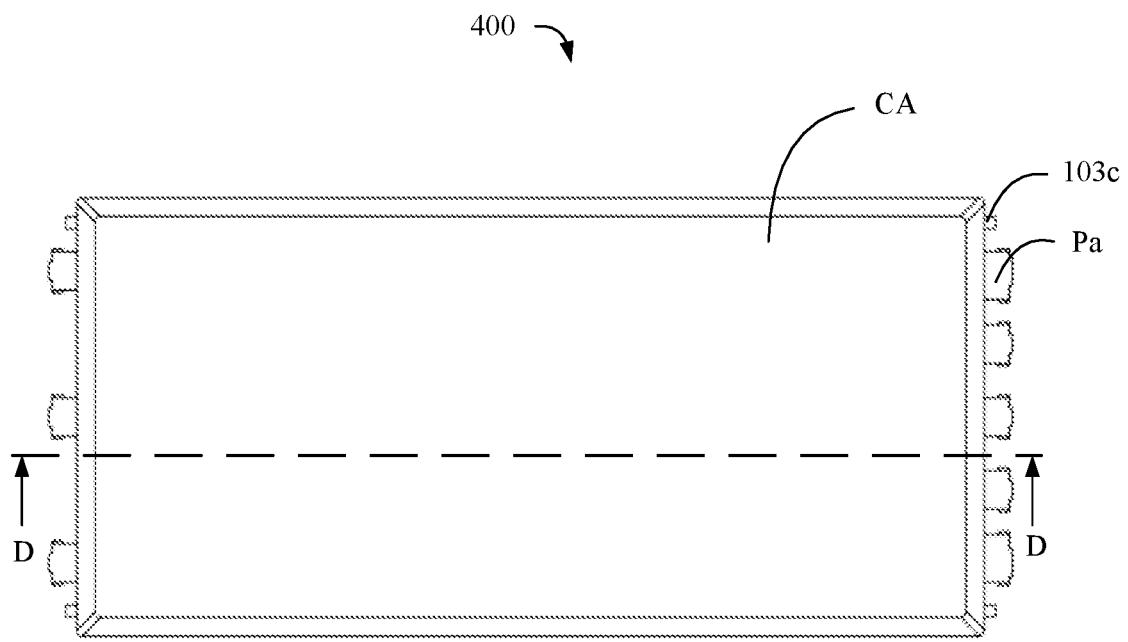
FIG. 13 is a schematic diagram of a top-view structure of a packaged integrated circuit board.

Further, as shown in FIG. 11, a cutting operation is performed on the auxiliary rib 103c along a third cutting line CL3, and a connection between the first pin part Pa and the horizontal rib 103a is broken, so that a plurality of plastically packaged circuit boards 200 in the packaged circuit board module 300 are detached from the lead frame 100, to obtain a plurality of independent packaged integrated circuit boards 400 shown in FIG. 13.

In this embodiment, after the horizontal rib 103a and the plurality of pins P are cut from the bezel 101, the auxiliary rib 103c is still connected to the pin P, and then when the second pin part Pb is bent, the auxiliary rib 103c can assist in completing automatic bending of the second pin part Pb, and can effectively ensure safety of the pin P during bending. Because the auxiliary rib 103c can effectively ensure safety of the pin P, there is no need to dispose another auxiliary structure to protect the pin P, thereby effectively reducing an area of the packaged integrated circuit board 400.

In addition, the plastic packaging process is performed on the first pin part Pa together with the circuit board 200, instead of connecting the first pin part Pa in a conductive connection manner such as reflow soldering only after the circuit board 200 is separately plastically packaged and is formed through cutting. Therefore, a conductive connection step of the pin P and the circuit board 200 is omitted while connection fastness between the first pin part Pa and the conductive connection pad Pad in the circuit board 200 is improved, thereby simplifying a packaging process of the circuit board 200. In addition, when the packaged circuit board module 300 is cut, cutting needs to be performed only on the second pin part Pb and the connecting rib 103, without a need to cut the plastic packaging casing CA, thereby effectively reducing cutting difficulty. In addition, safety of electronic components on the circuit board 200 in the plastic packaging casing CA can be ensured.

The electronic components are disposed on each of the first base surface 20a and the second base surface 20b that are opposite in the first base board 201, so that plastic packaging of a dual-sided circuit board can be effectively implemented, thereby effectively improving integration of the circuit board 200.

Figure 14:
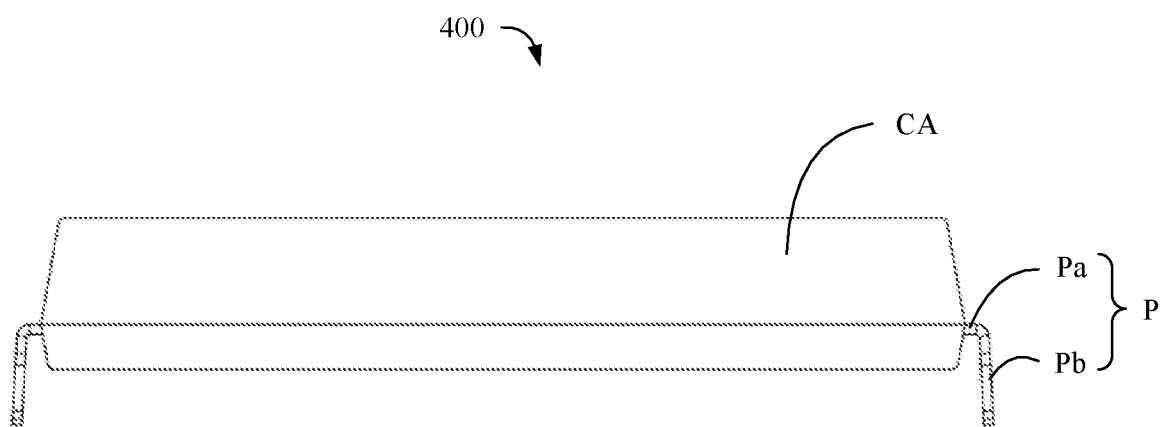
FIG. 14 is a schematic diagram of a front-view structure of a packaged integrated circuit board.
Figure 15:
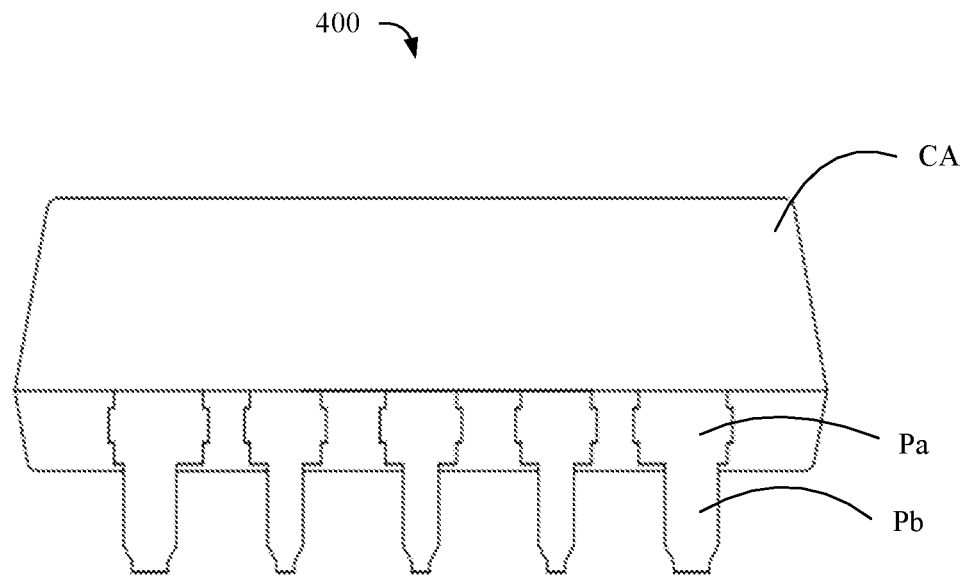
FIG. 15 is a schematic diagram of a left-view structure of a packaged integrated circuit board.
Figure 16:
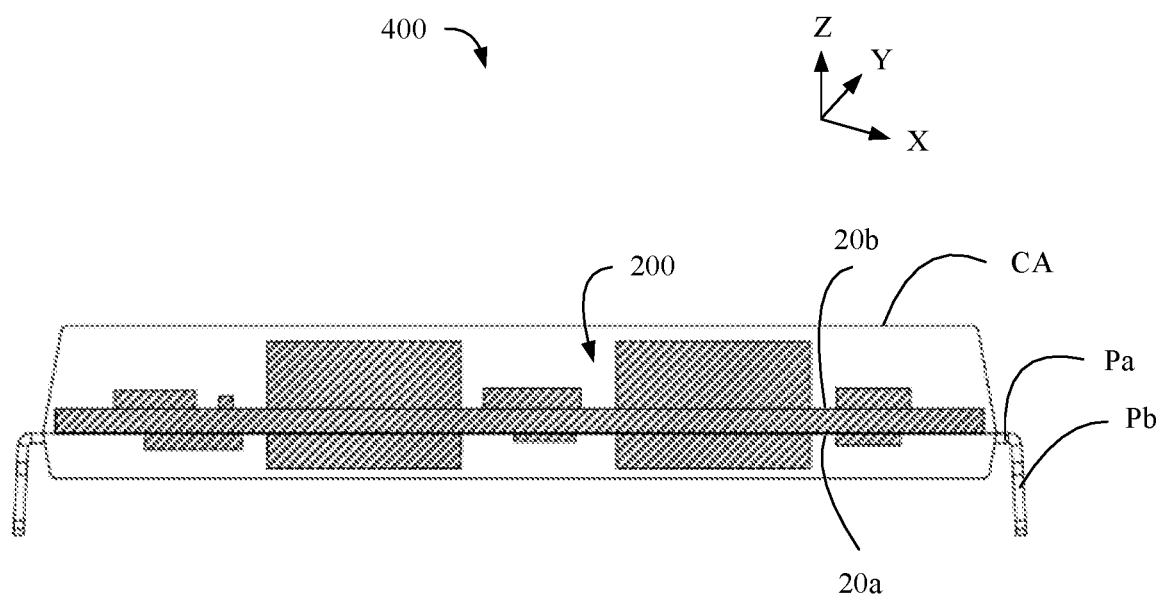
FIG. 16 is a schematic diagram of a cross-sectional structure of a packaged integrated circuit board along a line D-D shown in FIG. 13.

FIG. 13 is a schematic diagram of a top-view structure of the packaged integrated circuit board 400. FIG. 14 is a schematic diagram of a front-view structure of the packaged integrated circuit board 400. FIG. 15 is a schematic diagram of a left-view structure of the packaged integrated circuit board 400. FIG. 16 is a schematic diagram of a cross-sectional structure of the packaged integrated circuit board 400 along a line D-D shown in FIG. 13.

As shown in FIG. 13 to FIG. 16, the first pin part Pa and the auxiliary rib 103c are substantially covered by the packaging casing CA, and the second pin part Pb is perpendicular to the first pin part Pa and is exposed outside the packaging casing CA. In this embodiment, the second pin part Pb is configured to be electrically connect to another conductive line (not shown) by using the conductive connection agent. In a plurality of pins P disposed in parallel on one side of the packaged integrated circuit board 400, first pin parts of pins P arranged at the first position and the last position are connected to the auxiliary ribs 103c in the connecting rib 103.

As shown in FIG. 16, the electronic components on the first base surface 20a and the second base surface 20b located on upper and lower sides in the circuit board 200 are packaged in the packaging casing CA together with the first base board 201, thereby effectively improving integration of the circuit board 200, and also effectively improving safety of the electronic components in the circuit board 200. The plastic packaging process is performed on the pin P together with the circuit board 200, thereby effectively improving connection strength between the pin P and the conductive connection pad Pad in the circuit board 200.

Figure 17:
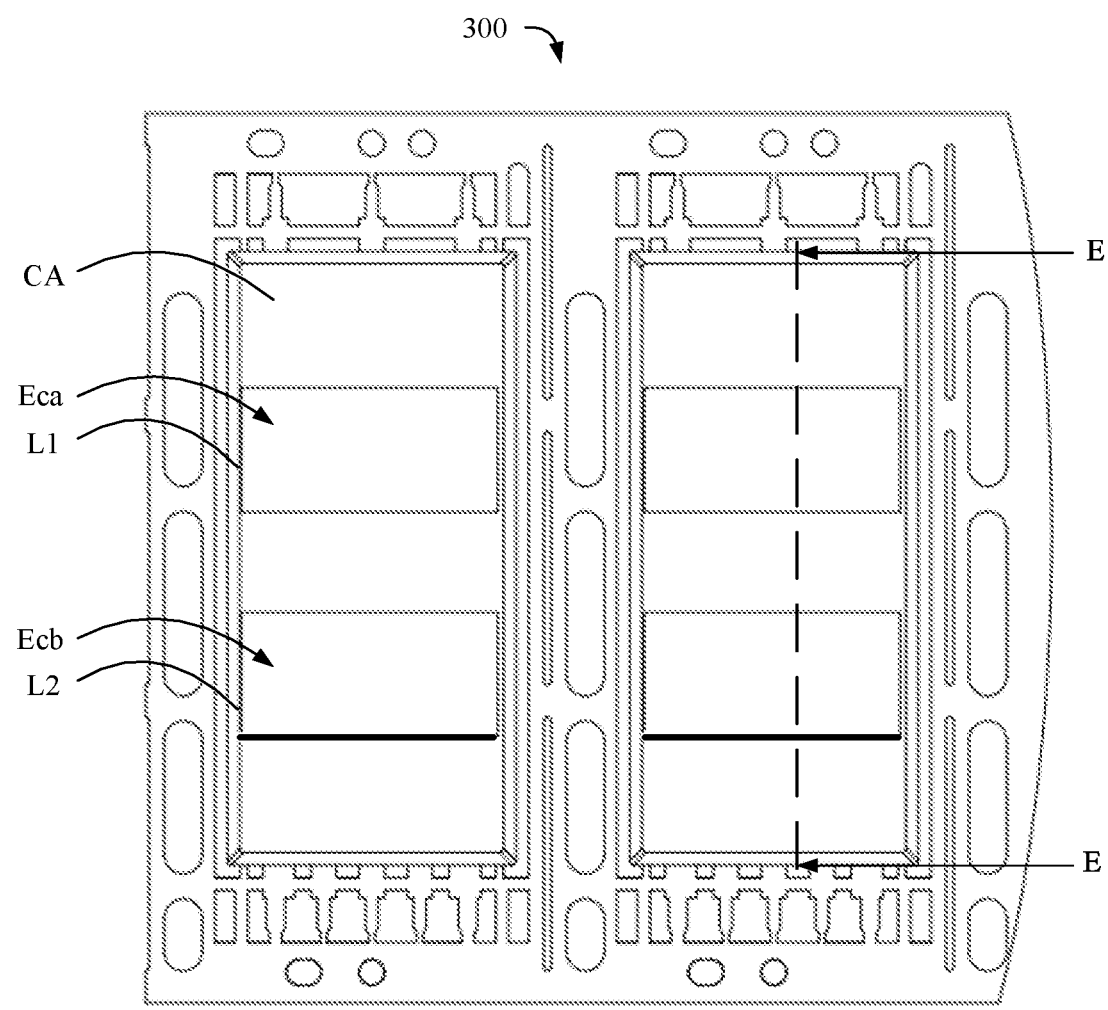
FIG. 17 is a schematic diagram of a planar structure obtained after a packaged circuit board module is ground according to a third embodiment of this application.
Figure 18:
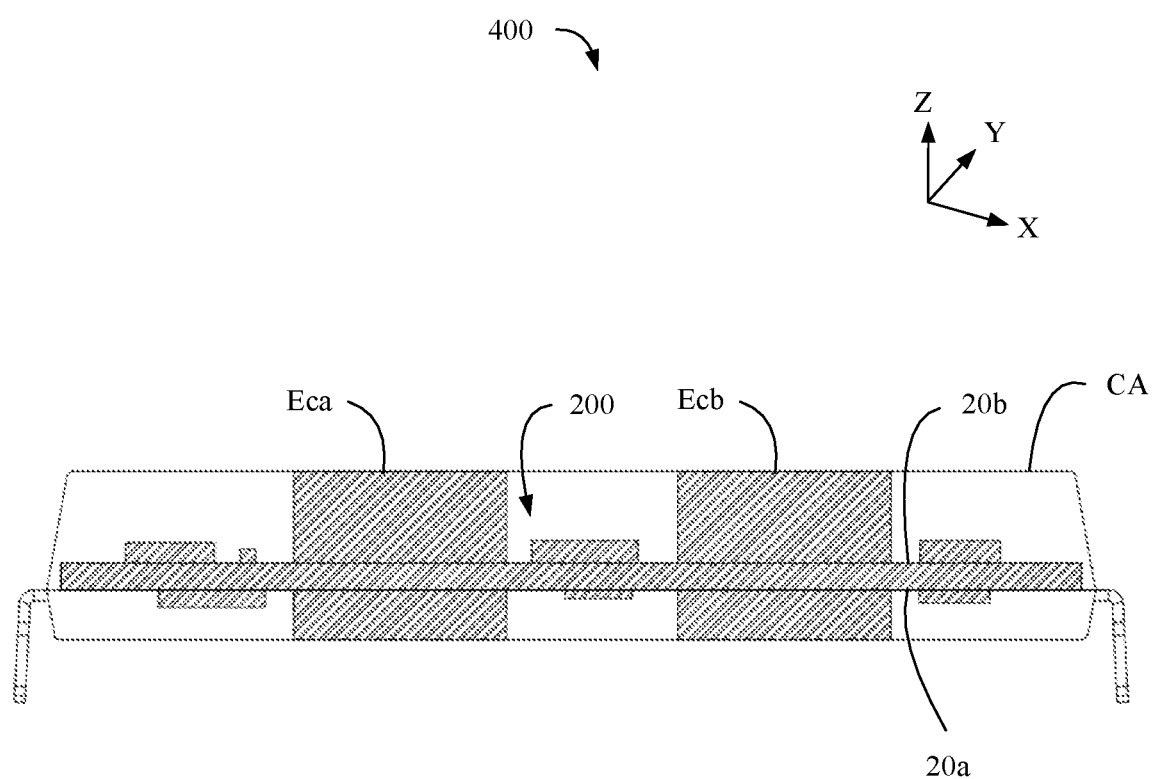
FIG. 18 is a schematic diagram of a cross-sectional structure, of a packaged integrated circuit board obtained after cutting separation is performed on the packaged circuit board module shown in FIG. 17 and a lead frame, along E-E.

FIG. 17 is a schematic diagram of a planar structure obtained after the packaged circuit board module 300 is ground according to a third embodiment of this application. FIG. 18 is a schematic diagram of a cross-sectional structure, of the packaged integrated circuit board 400 obtained after cutting separation is performed on the packaged circuit board module 300 shown in FIG. 17 and the lead frame 100, along E-E.

As shown in FIG. 17, after the circuit board 200 is plastically packaged and the packaged circuit board module 300 is obtained, plastic packaging materials at a position L1 of a first electronic component Eca and a position L2 of a second electronic component Ecb in the second electronic component group EC2 (FIG. 7) are ground, so that the first electronic component Eca and the second electronic component Ecb are exposed from the packaging casing CA in the packaged integrated circuit board 400 shown in FIG. 18, thereby improving heat dissipation efficiency of the first electronic component Eca and the second electronic component Ecb.

In this embodiment, the first electronic component Eca and the second electronic component Ecb each are an electronic component that emits a relatively large amount of heat in a working process, such as a transformer or a magnetic core.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A lead frame, comprising:
   a plurality of frame units disposed in parallel in a first direction;
   wherein each frame unit of the plurality of frame units comprises a bezel that is hollow, a plurality of pins, and connecting ribs that are disposed in the bezel;
   wherein, for each frame unit of the plurality of frame units, each pin of the plurality of pins comprises a first pin part and a second pin part that extend in a second direction and that are integrally formed, the first pin part is disposed in the bezel, the first pin part is configured to be electrically connected to a circuit board, the second pin is connected and fastened to the bezel, and the second direction is perpendicular to the first direction;
   wherein, for each frame unit of the plurality of frame units, the connecting ribs are connected among the plurality of pins and the bezel; and
   wherein, for a first frame unit of the plurality of frame units:
   the bezel is rectangular, and comprises two oppositely disposed first arms and two oppositely disposed second arms, the first arms extend in the second direction, the second arms extend in the first direction, the plurality of pins are disposed in parallel and in a direction parallel to the second arms, and an extension direction of the plurality of pins is parallel to the first arms; and
   each connecting rib of the plurality of connecting ribs of the first frame unit comprises a horizontal rib, reinforcing ribs, and auxiliary ribs, the horizontal rib is connected to the first pin part of each pin of the plurality of pins of the first frame unit and the bezel, the reinforcing ribs are connected to the horizontal rib and the bezel, and the auxiliary ribs are connected to the horizontal rib and the first pin part of each pin of the plurality of pins of the first frame unit.

2. The lead frame according to claim 1, wherein the first pin part of each pin of the plurality of pins of the first frame unit comprises a first penetration hole that penetrates through the first pin part in a third direction, the first penetration hole is configured to accommodate a conductive connection agent, and the third direction is perpendicular to a plane on which the first direction and the second direction are located.

3. The lead frame according to claim 1, wherein the first pin part of each pin of the plurality of pins of a first frame unit of the plurality of frame units comprises a boss, and the boss is connected to the first pin part in a direction perpendicular to an extension direction of the first pin part.

4. The lead frame according to claim 3, wherein the first pin part of each pin of the plurality of pins of the first frame unit further comprises a recessed part recessed in the third direction, and the recessed part is configured to accommodate a plastic packaging material.

5. The lead frame according to claim 4, wherein the recessed part and the boss are located on a same straight line in the first direction.

6. The lead frame according to claim 5, wherein the recessed part comprises a second penetration hole, the second penetration hole penetrates through the recessed part in the third direction, and the second penetration hole is configured to accommodate the plastic packaging material.

7. A packaged integrated circuit board, comprising:
a first base board;
a lead frame that comprises a plurality of frame units disposed in parallel in a first direction, wherein each frame unit of the plurality of frame units comprises a plurality of pins; and
a packaging casing;
wherein the first base board comprises a first base surface and a second base surface that are oppositely disposed, a plurality of electronic components, a plurality of conductive lines, and a plurality of conductive connection pads that are disposed on each of the first base surface and the second base surface, wherein the plurality of electronic components are electrically connected to the plurality of conductive connection pads through the plurality of conductive lines;
wherein each pin of the plurality of pins comprises a first pin part and a second pin part, and wherein the first base board is disposed in a hollow part in the lead frame, and the plurality of conductive connection pads are correspondingly connected and fastened to first pin parts in the plurality of pins in a one-to-one manner by using a conductive connection agent;
wherein the packaging casing is formed by plastically packaging the first base board and the first pin parts by using a plastic packaging material after the plurality of pins are electrically connected to the plurality of conductive connection pads by using the conductive connection agent, and the second pin parts are exposed outside the packaging casing;
wherein the first pin parts and the second pin parts extend in a same direction and are integrally formed on the respective pins;
wherein the plurality of pins are disposed in parallel on one side of the packaged integrated circuit board; and
wherein connecting ribs are disposed at the first pin parts of a first pin arranged at a first position and a second pin arranged at a last position among the plurality of pins.

8. The packaged integrated circuit board according to claim 7, wherein, for each pin of the plurality of pins, the first pin part comprises a first penetration hole that penetrates through the first pin in a direction perpendicular to the first base surface, and a conductive connection agent is accommodated in the first penetration hole.

9. The packaged integrated circuit board according to claim 7, wherein, for each pin of the plurality of pins, the first pin part comprises a boss, and the boss is connected to the first pin part in a direction perpendicular to an extension direction of the first pin part.

10. The packaged integrated circuit board according to claim 9, wherein, for each pin of the plurality of pins, the first pin part further comprises a recessed part recessed in the direction perpendicular to the first base surface, the recessed part is configured to accommodate the plastic packaging material, and the recessed part and the boss are located on a straight line in a first direction.

11. The packaged integrated circuit board according to claim 10, wherein, for each pin of the plurality of pins, the recessed part comprises a second penetration hole, the second penetration hole penetrates through the recessed part in the direction perpendicular to the first base surface, and the second penetration hole is configured to accommodate the plastic packaging material.

12. The packaged integrated circuit board of claim 11, wherein at least one of the plurality of electronic components is exposed from the packaging casing.

13. A circuit board packaging method, comprising:
providing a circuit board, wherein the circuit board comprises a first base board, a plurality of electronic components, a plurality of conductive lines, and a plurality of conductive connection pads, wherein the first base board comprises a first base surface and a second base surface that are opposite surfaces of the first base board, and wherein the plurality of conductive connection pads are disposed on each of the first base surface and the second base surface;
providing a lead frame, wherein the lead frame comprises a plurality of frame units disposed in parallel in a first direction, wherein each frame unit of the plurality of frame units comprises a bezel that is hollow, a plurality of pins, and connecting ribs, wherein each pin of the plurality of pins comprises a first pin part and a second pin part that extend in a same direction and that are integrally formed, the first pin part is disposed in the bezel, the second pin part is connected and fastened to the bezel, and wherein the connecting ribs are connected between the first pin part and the bezel;
fastening and connecting the circuit board to the lead frame, wherein the circuit board is correspondingly disposed in a hollow part in the lead frame, and the plurality of conductive connection pads are correspondingly connected and fastened to first pin parts of the plurality of pins;
plastically packaging the circuit board and the first pin parts of the plurality of pins, to form a packaging casing; and
performing a cutting operation at positions of connecting ribs in pins in each frame unit of the plurality of frame units, so that the plurality of pins are separated from the lead frame, to obtain a plurality of packaged integrated circuit boards.

14. The circuit board packaging method according to claim 13, wherein, for a first frame unit of the plurality of frame units, the connecting rib comprises a horizontal rib, reinforcing ribs, and auxiliary ribs, the horizontal rib is connected to the first pin part of each pin of the first frame unit and the bezel, the reinforcing ribs are connected to the horizontal rib and the bezel, and the auxiliary ribs are connected to the horizontal rib and the first pin part of each pin of the plurality of pins of the first frame unit; and
wherein performing the cutting operation at positions of the connecting ribs in pins comprises:
performing cutting at a connection position between the second pin parts of each pin of the plurality of pins of the first frame unit and the bezel, and breaking a connection between the second pin parts of each pin of the plurality of pins of the first frame unit and the bezel;
performing cutting between the plurality of pins and the horizontal rib, and breaking connections between the plurality of pins and the horizontal rib;
bending the second pin parts of each pin of the plurality of pins of the first frame unit by a first angle relative to the first pin parts of each pin of the plurality of pins of the first frame unit; and
performing cutting on the auxiliary ribs, and breaking connections between the plurality of pins of the first frame unit and the bezel.

15. The circuit board packaging method according to claim 14, wherein after plastically packaging the circuit board and the first pin parts of the plurality of pins, the method further comprises:

grinding the packaging casing at a position of at least one electronic component in the circuit board, wherein the at least one electronic component is exposed from the packaging casing.

* * * * *